United States Patent
Shimizu et al.

(10) Patent No.: US 9,748,343 B2
(45) Date of Patent: Aug. 29, 2017

(54) SEMICONDUCTOR DEVICE

(71) Applicant: Kabushiki Kaisha Toshiba, Minato-ku (JP)

(72) Inventors: Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/149,569

(22) Filed: May 9, 2016

(65) Prior Publication Data
US 2017/0033185 A1  Feb. 2, 2017

(30) Foreign Application Priority Data

Jul. 29, 2015 (JP) ................. 2015-149987

(51) Int. Cl.
*H01L 29/16* (2006.01)
*H01L 29/10* (2006.01)
(Continued)

(52) U.S. Cl.
CPC ........ *H01L 29/1608* (2013.01); *H01L 27/092* (2013.01); *H01L 29/045* (2013.01);
(Continued)

(58) Field of Classification Search
CPC ........... H01L 29/1608; H01L 29/66068; H01L 21/049; H01L 29/78; H01L 29/045; H01L 29/0696; H01L 21/02529; H01L 29/0878; H01L 29/785; H01L 21/02164; H01L 21/02378; H01L 21/823814; H01L 2924/13091; H01L 29/165; H01L 29/2003; H01L 21/02381; H01L 21/02447;
(Continued)

(56) References Cited

U.S. PATENT DOCUMENTS

2005/0077591 A1* 4/2005 Fukuda ................. H01L 29/045
257/500
2006/0223274 A1* 10/2006 Shimoida .............. H01L 29/267
438/312
(Continued)

FOREIGN PATENT DOCUMENTS

WO  WO 2008/123213 A1  10/2008
WO  WO 2012/060468 A1  5/2012
WO  WO 2012/086387 A1  6/2012

OTHER PUBLICATIONS

M. Nagase, et al., "Local conductance measurements of double-layer graphene on SiC substrate", Nanotechnology, (20), 2009, 7 pgs.

*Primary Examiner* — Caleen Sullivan
(74) *Attorney, Agent, or Firm* — Oblon, McClelland, Maier & Neustadt, L.L.P.

(57) ABSTRACT

A semiconductor device of an embodiment includes a SiC layer having a surface inclined with respect to a {000-1} face at an angle of 0° to 10° or a surface a normal line direction of which is inclined with respect to a <000-1> direction at an angle of 80° to 90°, a gate electrode, an insulating layer at least a part of which is provided between the surface and the gate electrode, and a region, at least apart of which is provided between the surface and the insulating layer, including a bond between carbon and carbon.

28 Claims, 14 Drawing Sheets

(51) Int. Cl.
*H01L 27/092* (2006.01)
*H01L 29/04* (2006.01)
*H01L 29/739* (2006.01)
*H01L 29/66* (2006.01)
*H01L 29/78* (2006.01)

(52) U.S. Cl.
CPC ...... *H01L 29/1054* (2013.01); *H01L 29/1095* (2013.01); *H01L 29/66068* (2013.01); *H01L 29/7393* (2013.01); *H01L 29/7802* (2013.01); *H01L 29/7813* (2013.01)

(58) Field of Classification Search
CPC ........... H01L 21/02532; H01L 29/0649; H01L 29/4925; H01L 29/4933; H01L 29/4941
USPC .......................................................... 257/77
See application file for complete search history.

(56) References Cited

U.S. PATENT DOCUMENTS

2010/0072485 A1 3/2010 Suda et al.
2013/0214253 A1 8/2013 Hiura et al.
2013/0272951 A1 10/2013 Hiura et al.

\* cited by examiner

SEMICONDUCTOR DEVICE

CROSS-REFERENCE TO RELATED APPLICATION

This application is based upon and claims the benefit of priority from Japanese Patent Application No. 2015-149987, filed on Jul. 29, 2015, the entire contents of which are incorporated herein by reference.

FIELD

Embodiments described herein relate generally to a semiconductor device.

BACKGROUND

Silicon carbide (SiC) is expected to be a material for a next-generation semiconductor device. SiC has excellent physical properties, such as triple the band gap, about ten times the breakdown field strength, and about triple the thermal conductivity of silicon (Si). By utilizing the characteristics, a semiconductor device that is low loss and capable of operating at high temperature can be implemented.

However, for example, carrier mobility in an interface between a semiconductor and an insulating layer in a metal insulator semiconductor (MIS) structure formed using silicon carbide (SiC) is lower than that in a MIS structure formed using silicon (Si). This causes the problem that on-resistance of a metal insulator semiconductor field effect transistor (MISFET) or an insulated gate bipolar transistor (IGBT) becomes high.

DETAILED DESCRIPTION

A semiconductor device of an embodiment includes a SiC layer having a surface inclined with respect to a {000-1} face at an angle of 0° to 10° or a surface a normal line direction of which is inclined with respect to a <000-1> direction at an angle of 80° to 90°, a gate electrode, an insulating layer at least a part of which is provided between the surface and the gate electrode, and a region, at least apart of which is provided between the surface and the insulating layer, including a bond between carbon and carbon.

Hereinafter, embodiments of the present disclosure will be described with reference to the drawings. Note that, in the following description, the same reference signs are assigned to the same members and the like, and the description of the member that has been described will be appropriately omitted.

Furthermore, in the following description, $n^+$, n, and $n^-$, or p', p, and $p^-$ represent relative levels of impurity concentration in each conductive type. That is, $n^+$ has a relatively higher n-type impurity concentration than n, and $n^-$ has a relatively lower n-type impurity concentration than n. Furthermore, $p^+$ has a relatively higher p-type impurity concentration than p, and $p^-$ has a relatively lower p-type impurity concentration than p. Note that, an $n^+$-type and an $n^-$-type will be also simply referred to as an n-type, and a $p^+$-type and a $p^-$-type will be also simply referred to as a p-type.

First Embodiment

A semiconductor device of the present embodiment includes a SiC layer having a surface inclined with respect to a {000-1} face at an angle of 0° to 10°, a gate electrode, an insulating layer at least a part of which is provided between the surface and the gate electrode, and a region, at least a part of which is provided between the surface and the insulating layer, including a bond between carbon and carbon.

Hereinafter, the above region will be referred to as an interface region.

Figure 1:
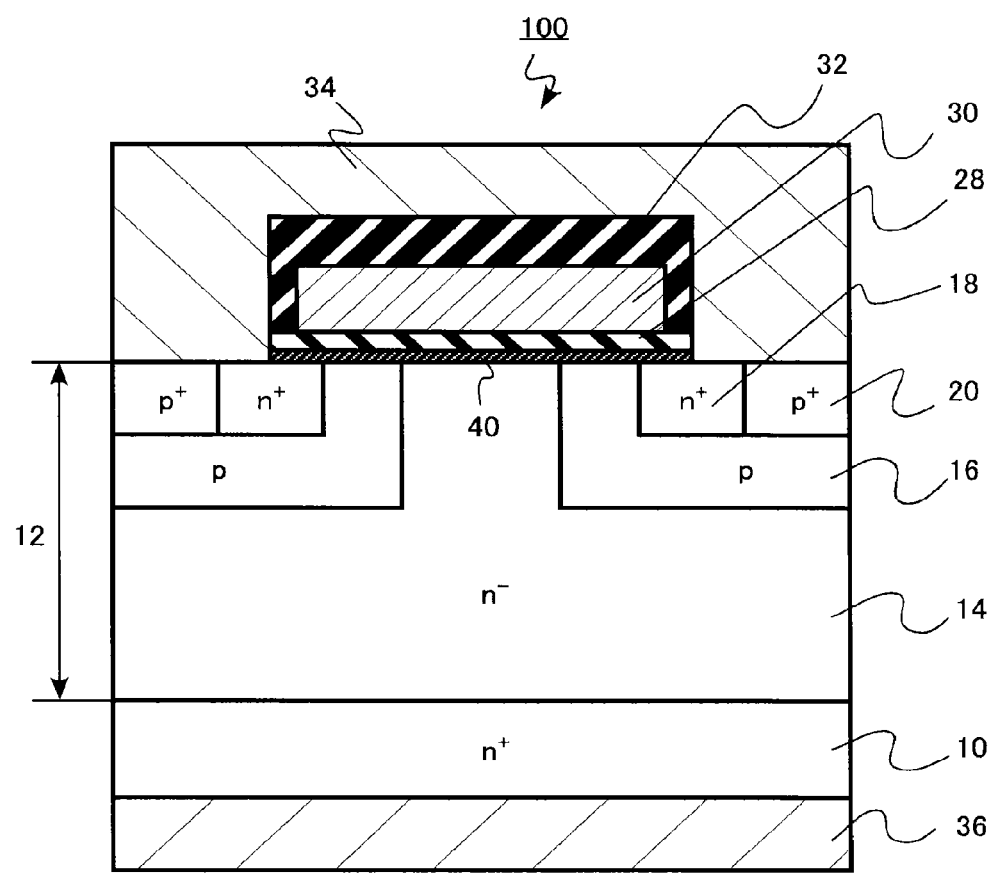
FIG. 1 is a schematic sectional view illustrating a semiconductor device of a first embodiment.

FIG. 1 is a schematic sectional view illustrating a configuration of a MISFET that is the semiconductor device of the present embodiment. A MISFET 100 is a double implantation MOSFET (DIMOSFET). A p-well region and a source region of the DIMOSFET are formed by ion implantation. The MISFET 100 is an n-type MISFET having electrons as carriers. The MISFET 100 is a vertical device.

The MISFET 100 includes a SiC substrate 10, a SiC layer 12, adrift region (first SiC region) 14, a p-well region (third SiC region) 16, a source region (second SiC region) 18, a p-well contact region 20, an interface region 40, a gate insulating layer (insulating layer) 28, a gate electrode 30, an interlayer insulating layer 32, a source electrode (electrode) 34, and a drain electrode 36.

In the description, an upper face with respect to a face of the SiC substrate 10 or the like in FIG. 1 is referred to as a surface, and a lower face with respect to a face of the SiC substrate 10 or the like in FIG. 1 is referred to as a back surface.

The MISFET 100 includes the $n^+$-type SiC substrate 10. The SiC substrate 10 is a 4H—SiC substrate including, for example, nitrogen (N) as an n-type impurity. The impurity concentration of the n-type impurity is, for example, $1\times10^{18}$ cm$^{-3}$ or more and $1\times10^{20}$ cm$^{-3}$ or less.

Figure 2:
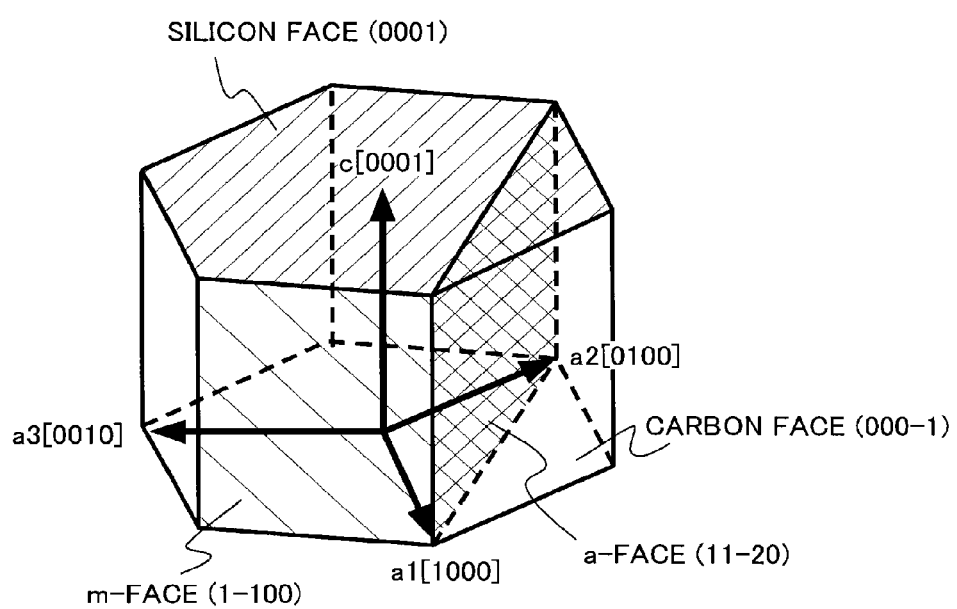
FIG. 2 is a diagram illustrating a crystal structure of a SiC semiconductor of the first embodiment.

FIG. 2 is a diagram illustrating a crystal structure of a SiC semiconductor. The representative crystal structure of the SiC semiconductor is a hexagonal crystal system, such as 4H—SiC. A face having a c-axis along the axial direction of the hexagonal prism as a normal line (the top face of the hexagonal prism) is a (0001) face. The face equivalent to the (0001) face is referred to as a silicon face and indicated as a {0001} face. Silicon (Si) atoms are arranged on the silicon face.

The other face having the c-axis along the axial direction of the hexagonal prism as the normal line (the top face of the hexagonal prism) is a (000-1) face. The face equivalent to the (000-1) face is referred to as a carbon face and indicated as a {000-1} face. Carbon (C) atoms are arranged on the carbon face.

On the other hand, a side face (prismatic face) of the hexagonal prism is an m-face equivalent to a (1-100) face, that is, a {1-100} face. The {1-100} face is parallel to a <000-1> direction. In other words, the normal line direction of the {1-100} face is inclined with respect to the <000-1> direction at 90°.

Furthermore, a face passing a pair of edge lines that are not adjacent to each other is an a-face equivalent to a (11-20) face, that is, a {11-20} face. The {11-20} face is parallel to the <000-1> direction. In other words, the normal line direction of the {11-20} face is inclined with respect to the <000-1> direction at 90°.

Both silicon (Si) and carbon (C) are arranged on the m-face and the a-face.

Hereinafter, it will be described the case where the surface of the SiC substrate 10 is inclined with respect to the carbon face at an angle of 0° to 10°, and the back surface is inclined with respect to the silicon face at an angle of 0° to 10°.

The SiC layer 12 is provided on the SiC substrate 10. The SiC layer 12 includes, for example, nitrogen (N) as the n-type impurity. The n-type impurity concentration in the SiC layer 12 is, for example, $5\times10^{15}$ cm$^{-3}$ or more and $2\times10^{16}$ cm$^{-3}$ or less. The SiC layer 12 is, for example, a SiC epitaxial growth layer formed on the SiC substrate 10 by the epitaxial growth.

The surface of the SiC layer 12 is inclined with respect to the carbon face at an angle of 0° to 10°. The layer thickness of the SiC layer 12 is, for example, 5 μm or more and 100 μm or less.

The n$^-$-type drift region (the first SiC region) 14 is provided in the SiC layer 12. A part of the drift region 14 is in contact with the interface region 40.

The drift region 14 includes, for example, nitrogen (N) as the n-type impurity. The n-type impurity concentration in the drift region 14 is, for example, $5\times10^{15}$ cm$^{-3}$ or more and $2\times10^{16}$ cm$^{-3}$ or less.

The p-type p-well region (the third SiC region) 16 is provided in the SiC layer 12. The p-well region 16 is provided between the drift region 14 and the source region 18. A part of the p-well region 16 is in contact with the interface region 40.

The p-well region 16 includes, for example, aluminum (Al) as a p-type impurity. The p-type impurity concentration in the p-well region 16 is, for example, $5\times10^{15}$ cm$^{-3}$ or more and $1\times10^{17}$ cm$^{-3}$ or less. The depth of the p-well region 16 is, for example, about 0.6 μm.

The n$^+$-type source region 18 is provided in the SiC layer 12. The source region 18 is provided in the p-well region 16. A part of the source region 18 is in contact with the interface region 40.

The source region 18 includes, for example, nitrogen (N) as the n-type impurity. Then-type impurity concentration in the source region 18 is, for example, $1\times10^{18}$ cm$^{-3}$ or more and $1\times10^{22}$ cm$^{-3}$ or less. The depth of the source region 18 is shallower than that of the p-well region 16. The depth of the source region 18 is, for example, about 0.3 μm.

Furthermore, the p$^+$-type p-well contact region 20 is provided in the SiC layer 12. The p-well contact region 20 is provided in the p-well region 16. The p-well contact region 20 is provided on a side of the source region 18.

The p-well contact region 20 includes, for example, aluminum (Al) as the p-type impurity. The p-type impurity concentration in the p-well contact region 20 is, for example, $1\times10^{18}$ cm$^{-3}$ or more and $1\times10^{22}$ cm$^{-3}$ or less. The depth of the p-well contact region 20 is shallower than that of the p-well region 16 and, for example, about 0.3 μm.

At least apart of the gate insulating layer (insulating layer) 28 is provided on the drift region 14, the p-well region 16, and the source region 18. The gate insulating layer (insulating layer) 28 is provided between the surface of the SiC layer 12 and the gate electrode 30.

For example, an oxide film is applied to the gate insulating layer 28. For example, a silicon oxide film, a silicon oxynitride film, or a high-k insulating layer is applicable to the gate insulating layer 28.

The gate electrode 30 is provided on the gate insulating layer 28. For example, doped polysilicon or the like is applicable to the gate electrode 30.

The interlayer insulating layer 32 is provided on the gate electrode 30. The interlayer insulating layer 32 is formed of, for example, a silicon oxide film.

At least a part of the interface region 40 is provided between the surface of the SiC layer 12 and the gate insulating layer 28. The interface region 40 is two-dimensionally provided between the surface of the SiC layer 12 and the gate insulating layer 28. The interface region 40 is provided between the drift region 14 and the gate insulating layer 28, between the p-well region 16 and the gate insulating layer 28, and between the source region 18 and the gate insulating layer 28. The interface region 40 functions as a channel of the MISFET 100.

Figure 3:
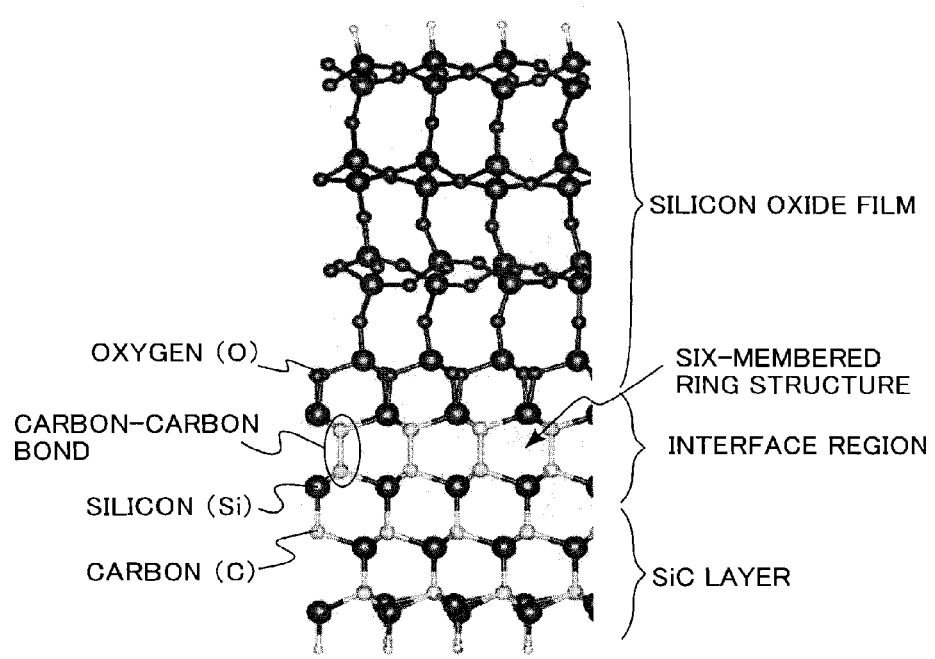
FIG. 3 is a diagram illustrating a bonding structure of an atom in an interface region of the first embodiment.

FIG. 3 is a diagram illustrating a bonding structure of an atom in the interface region. FIG. 3 illustrates the case where the gate insulating layer 28 is a silicon oxide film. The interface region 40 includes a bond between carbon and carbon (carbon-carbon bond).

The Interface region 40 includes a six-membered ring structure having a silicon-carbon-carbon-silicon-carbon-carbon bond. A single layer having the six-membered ring structure is two-dimensionally provided between the surface of the SiC layer 12 and the gate insulating layer 28.

Silicon on the upper side of the six-membered ring structure is bonded to oxygen on the silicon oxide film. Silicon on the lower side of the six-membered ring structure is bonded to carbon on the SiC layer.

The bonding structure of the atom in the interface region 40 can be observed with, for example, a transmission electron microscope (TEM).

The carbon concentration in the interface region 40 is higher than those of the SiC layer 12 and the gate insulating layer 28. Thus, the peak of the carbon concentration distribution in the SiC layer 12, the interface region 40, and the gate insulating layer 28 exists in the interface region 40.

The area density of carbon in the interface region 40 is, for example, $1.2\times10^{14}$ cm$^{-2}$ or more and $2.4\times10^{15}$ cm$^{-2}$ or less.

The volume density of carbon in the interface region 40 is, for example, $4.8 \times 10^{21}$ cm$^{-3}$ or more and $2.0 \times 10^{23}$ cm$^{-3}$ or less.

The carbon concentration distribution, the carbon area density, and the carbon volume density can be measured by, for example, a secondary ion mass spectroscopy (SIMS).

The threshold voltage or the on-resistance of the MISFET 100 can be adjusted by, for example, doping the n-type impurity or the p-type impurity into the SiC layer 12 directly below the interface region 40. Electrons or positive holes are supplied to the interface region 40 from the SiC layer 12 doped with the n-type impurity or the p-type impurity, and the threshold voltage or on-resistance of the MISFET 100 can be adjusted. Furthermore, a silicon atom having the six-membered ring structure in the interface region 40 is activated by, for example, being substituted with the n-type impurity or p-type impurity, and the threshold voltage or the on-resistance of the MISFET 100 can be adjusted accordingly.

The source electrode 34 is provided on the SiC layer 12. The source electrode 34 is electrically connected to the source region 18 and the p-well contact region 20. A side of the source electrode 34 is in contact with the interface region 40. The source electrode 34 also functions as a p-well electrode that applies a potential to the p-well region 16.

The source electrode 34 is a conductive material. The source electrode 34 is, for example, metal or metal silicide. The source electrode 34 has, for example, a laminate structure of a nickel silicide layer and an aluminum (Al) metal layer on the nickel silicide layer.

The drain electrode 36 is provided on a side of the SiC substrate 10 that is the opposite side of the SiC layer 12, that is, on the back surface side. The drain electrode 36 is electrically connected to the SiC substrate 10.

The drain electrode 36 is a conductive material. The drain electrode 36 is, for example, metal or metal silicide. The drain electrode 36 has, for example, a laminate structure of a nickel silicide layer and a gold (Au) layer on the nickel silicide layer.

Note that, in the present embodiment, the n-type impurity is preferably, for example, nitrogen (N) or phosphorus (P), but arsenic (As) or antimony (Sb) is also applicable. Furthermore, the p-type impurity is preferably, for example, aluminum (Al), but boron (B), gallium (Ga), or indium (In) is also applicable.

Next, an example of a method for manufacturing the semiconductor device of the present embodiment will be described. The method for manufacturing the semiconductor device of the present embodiment includes thermally oxidizing a surface of a SiC layer, the surface is inclined with respect to the {000-1} face at an angle of 0° to 10°, at 900° C. or lower at oxygen partial pressure of 10% or less, depositing an insulating layer, and forming a gate electrode on the insulating layer.

Figure 4:
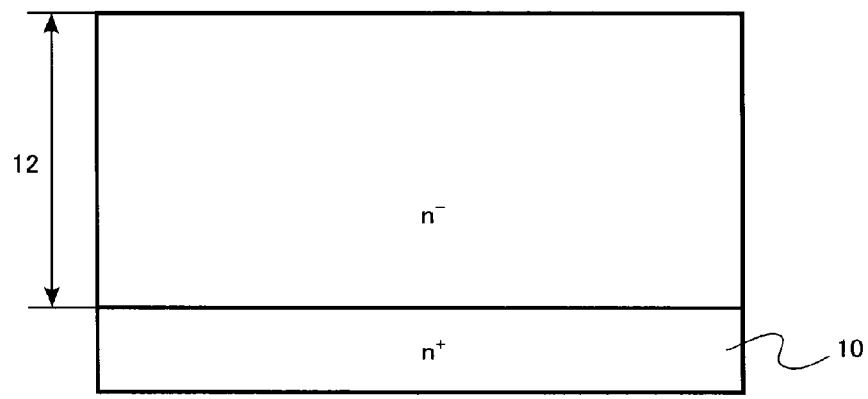
FIG. 4 is a schematic sectional view illustrating a manufacturing process of the first embodiment.

FIGS. 4 to 8 are schematic sectional views illustrating the semiconductor device during a manufacturing process in the method for manufacturing the semiconductor device of the present embodiment;

First, the n$^+$-type SiC substrate 10, in which the surface is the carbon face and the back surface is the silicon face, is prepared. Next, the n$^-$-type SiC layer 12 is formed on the surface of the SiC substrate 10 by the epitaxial growth method (FIG. 4).

Figure 5:
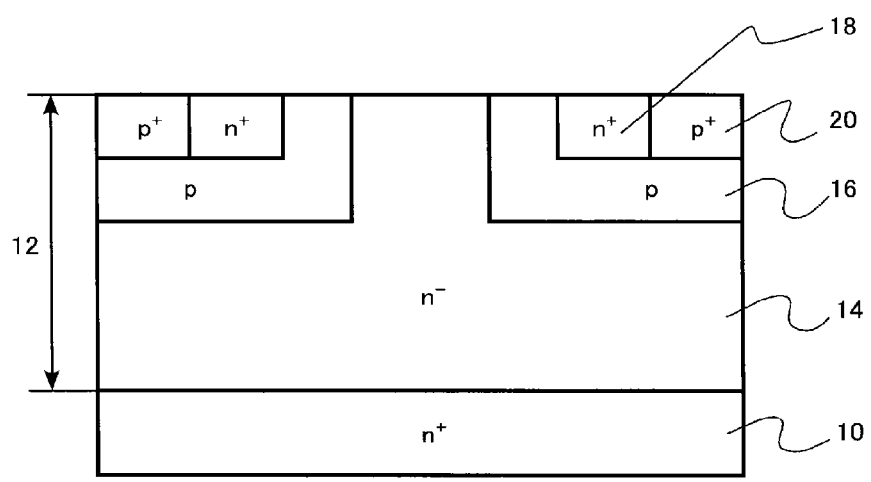
FIG. 5 is a schematic sectional view illustrating a manufacturing process of the first embodiment.

Next, the p-type p-well region 16, the n$^+$-type source region 18, and the p'-type p-well contact region 20 are formed by a known photolithography method and ion implantation method. A part of the n$^-$-type SiC layer 12 becomes the drift region 14 (FIG. 5).

Next, the surface of the SiC layer 12 is thermally oxidized. The thermal oxidation is performed at 900° C. or lower at oxygen partial pressure of 10% or less. For example, first, the surface of the SiC layer 12 is dry-oxidized at 800° C. at oxygen partial pressure of 1%. Furthermore, the surface of the SiC layer 12 is wet-oxidized at 600° C. or lower, for example, at 500° C.

Figure 6:
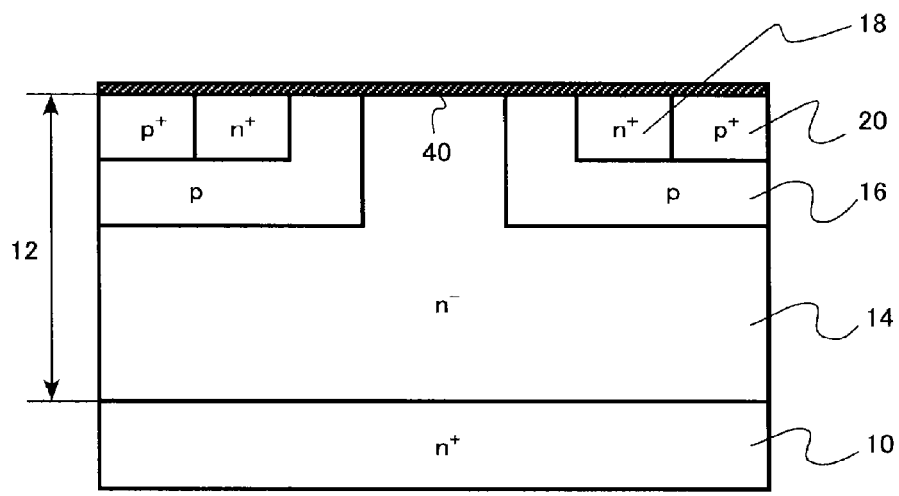
FIG. 6 is a schematic sectional view illustrating a manufacturing process of the first embodiment.

By the oxidation, the interface region 40 including the single layer having the six-membered ring structure is formed on the surface of the SiC layer 12 (FIG. 6). The six-membered ring structure includes a silicon-carbon-carbon-silicon-carbon-carbon bond. A single layer or an extremely thin silicon oxide film is formed on the outermost surface of the interface region 40.

Figure 7:
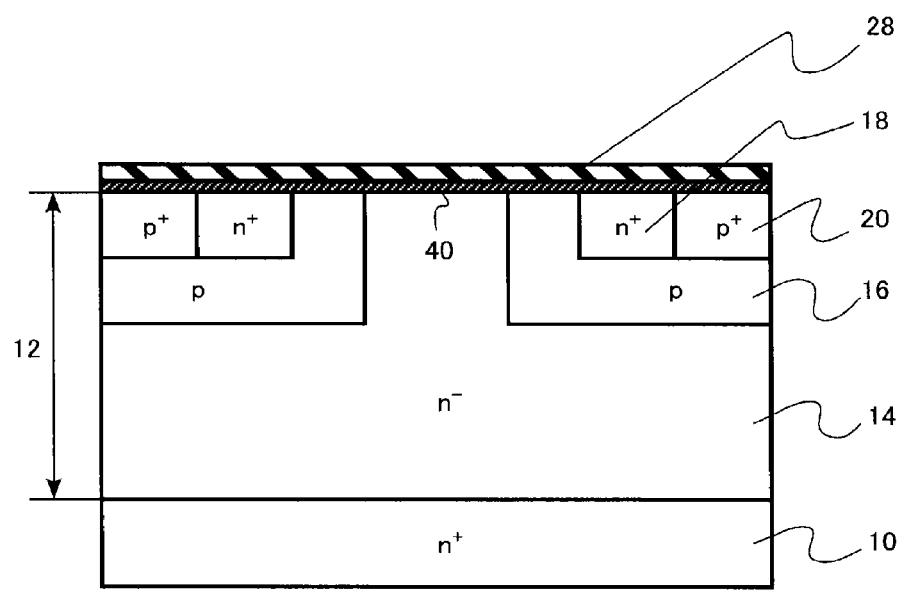
FIG. 7 is a schematic sectional view illustrating a manufacturing process of the first embodiment.

Next, the gate insulating layer 28 is formed on the interface region 40 (FIG. 7). The gate insulating layer 28 is, for example, a silicon oxide film formed by a deposition method such as a low pressure chemical vapor deposition (LPCVD) method.

After forming the gate insulating layer 28, annealing may be performed to densify the gate insulating layer 28. The annealing is performed, for example, under an atmosphere of inert gas, such as nitrogen or argon, at a temperature of 1200° C. to 1300° C.

Figure 8:
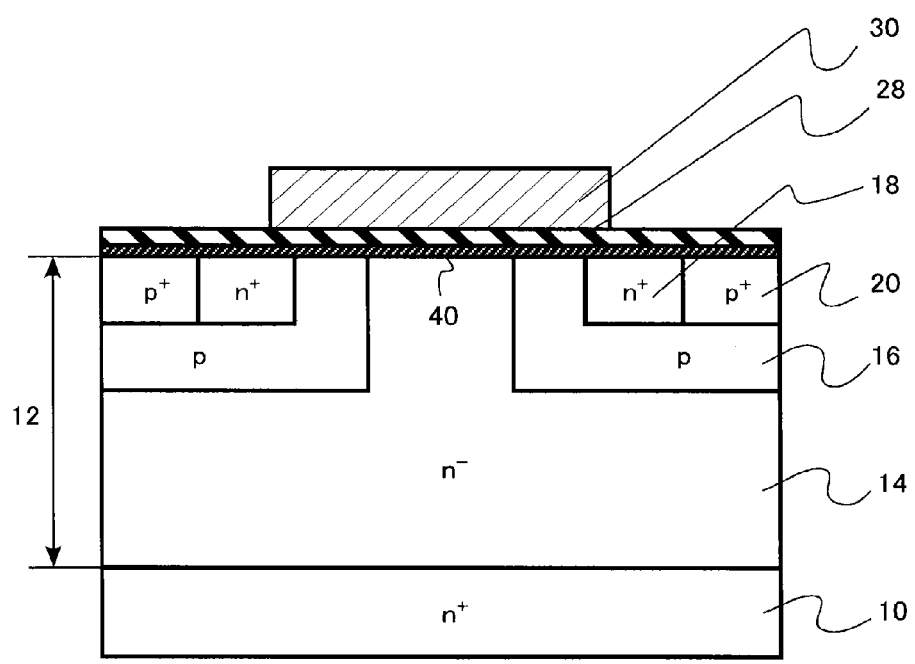
FIG. 8 is a schematic sectional view illustrating a manufacturing process of the first embodiment.

Next, the gate electrode 30 is formed on the gate insulating layer 28 by a known method (FIG. 8). The gate electrode 30 is, for example, doped polysilicon formed by the LPCVD method.

Thereafter, the interlayer insulating layer 32, the source electrode 34, and the drain electrode 36 are formed by a known process, and the MISFET 100 of the present embodiment illustrated in FIG. 1 is manufactured.

Hereinafter, functions and effects of the semiconductor device of the present embodiment will be described.

The inventors demonstrated, from the results of the first principle calculation, that the structure of the SiC layer 12, the interface region 40 including the single layer having the six-membered ring structure, and the gate insulating layer 28 illustrated in FIG. 3 is stable. Furthermore the inventors demonstrated that the interface region 40 including the six-membered ring structure forms a two-dimensional electronic state extending in the direction of the interface between the SiC layer 12 and the gate insulating layer 28. Consequently, the carrier mobility in the interface region 40 is improved, and the on-resistance of the MISFET 100 is reduced.

Figure 9:
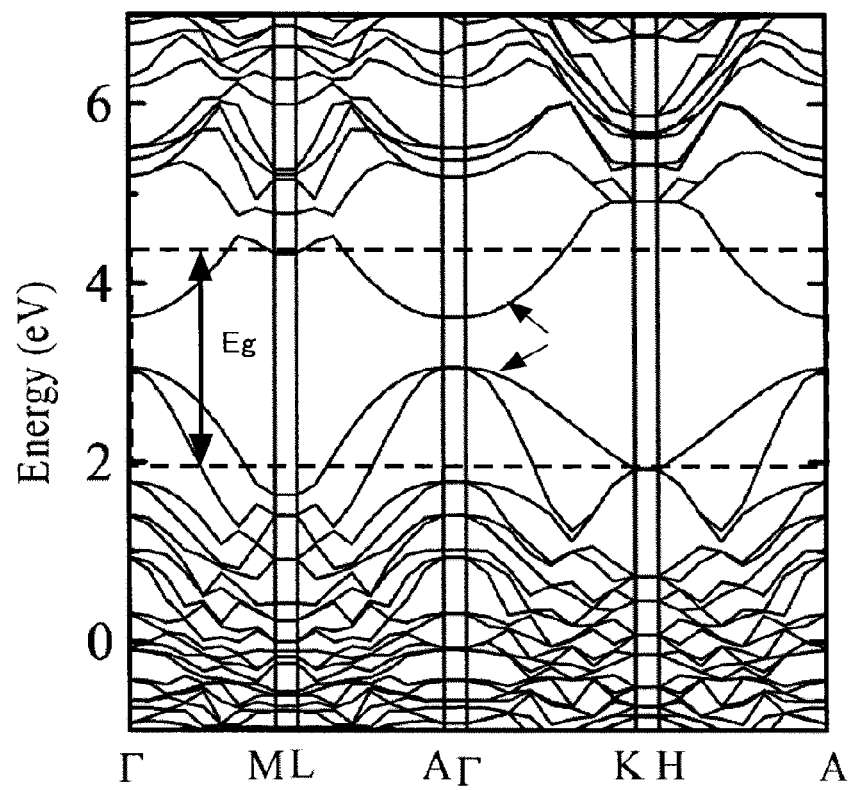
FIG. 9 is a graph illustrating an electronic state on a surface of the semiconductor device of the first embodiment.

FIG. 9 is a graph illustrating an electronic state on the surface of the semiconductor device of the present embodiment. The electronic state of the six-membered ring structure having a silicon-carbon-carbon-silicon-carbon-carbon bond is calculated by the first principle calculation. The horizontal axis is a wave number k, and the vertical axis is energy. The region between dashed lines indicates a band gap of bulk SiC. The two headed arrow indicates band gap energy.

As indicated by the one headed arrow in FIG. 9, an electronic state having large dispersion extending in the band gap of SiC exists. The electronic state has large dispersion in the plane and small dispersion in the film thickness direction. Thus, the effective mass of the carriers becomes light in the planar direction of the interface region 40, and the carrier mobility is improved in the planar direction of the interface region 40.

As oxygen is supplied to the carbon face of the SiC layer 12, a part of silicon in the SiC layer 12 is raised to the outermost surface. Then, carbon on the outermost surface of the SiC layer 12 is pushed into the bulk in the SiC layer 12. Carbon pushed into the bulk in the SiC layer 12 is bonded to carbon in a lower layer and forms a carbon-carbon bond. Then, silicon raised to the outermost surface is bonded to oxygen.

By proceeding the above processes when the surface of the SiC layer 12 is oxidized, the structure of the SiC layer 12, the interface region 40 including the single layer having the six-membered ring structure, and the gate insulating layer 28 illustrated in FIG. 3 is formed.

In order to stably form the interface region 40 including the single layer having the six-membered ring structure and the silicon oxide film in an upper layer, the oxidation is performed for a short time on the condition that the oxidation rate is extremely slow. Especially, the oxidation is preferably performed at a low temperature of 900° C. or lower at low oxygen partial pressure of 10% or less. In order for the interface region 40 to be stable, the dangling bond of silicon is preferably terminated with a hydroxyl group (OH group) by further performing wet-oxidization that is a low oxidation rate at 600° C. or lower. It is difficult to stably form the single layer having the six-membered ring structure on the condition that the oxidation rate is fast.

Furthermore, in the MISFET 100 of the present embodiment, the valence band and the conduction band in the interface region 40 extend in the band gap as illustrated in FIG. 9. Thus, the contact resistance between the source electrode 34 and the interface region 40 is reduced. Furthermore, the contact resistance between the source region 18 and the interface region 40 is reduced. Consequently, the on-resistance of the MISFET 100 is reduced.

As described above, the MISFET 100 of the present embodiment includes the interface region 40 having high carrier mobility between the SiC layer 12 and the gate insulating layer 28. Furthermore, in the MISFET 100 of the present embodiment, the contact resistance between the source electrode 34 and the interface region 40, and the contact resistance between the source region 18 and the interface region 40 are low. Consequently, according to the present embodiment, the MISFET 100 having low on-resistance can be implemented.

Second Embodiment

A semiconductor device of the present embodiment is different from that of the first embodiment in that a normal line direction of a surface of a SiC layer is inclined with respect to a <000-1> direction at an angle of 80° to 90°. The description overlapping with the first embodiment will be omitted.

A configuration of a MISFET of the present embodiment is similar to that illustrated in FIG. 1. Hereinafter, the MISFET of the present embodiment will be described with reference to FIG. 1.

In the MISFET of the present embodiment, the normal line direction of the surface of the SiC layer 12 is inclined with respect to a <000-1> direction at an angle of 80° to 90°. For example, the surface of the SiC layer 12 is an m-face or an a-face.

In the present embodiment, an interface region 40 is provided between the surface of the SiC layer 12 and a gate insulating layer 28 similarly to the first embodiment. The interface region 40 is two-dimensionally provided between the surface of the SiC layer 12 and the gate insulating layer 28. The interface region 40 functions as a channel of the MISFET.

The interface region 40 includes a six-membered ring structure having a silicon-carbon-carbon-silicon-carbon-carbon bond. A single layer having the six-membered ring structure is two-dimensionally provided between the surface of the SiC layer 12 and the gate insulating layer 28.

Especially in the case where the surface of the SiC layer 12 is the m-face, carbon-carbon bonds in the interface region 40 are ranged in stripes. Thus, a two-dimensional electronic state is further extended in comparison with the carbon face or the a-face. Consequently, the carrier mobility is further improved. In order to achieve high carrier mobility, the surface of the SiC layer 12 is preferably inclined with respect to the {1-100} face at an angle of 0° to 10°.

As described above, according to the present embodiment, the interface region 40 having high carrier mobility is provided between the SiC layer 12 and the gate insulating layer 28 similarly to the first embodiment. Furthermore, the contact resistance between the source electrode 34 and the interface region 40, and the contact resistance between the source region 18 and the interface region 40 are reduced. Consequently, according to the present embodiment, the MISFET having low on-resistance can be implemented.

Third Embodiment

A semiconductor device of the present embodiment is different from that of the first embodiment in that an interface region is provided between an electrode and a surface of a SiC layer. The description overlapping with the first embodiment will be omitted.

Figure 10:
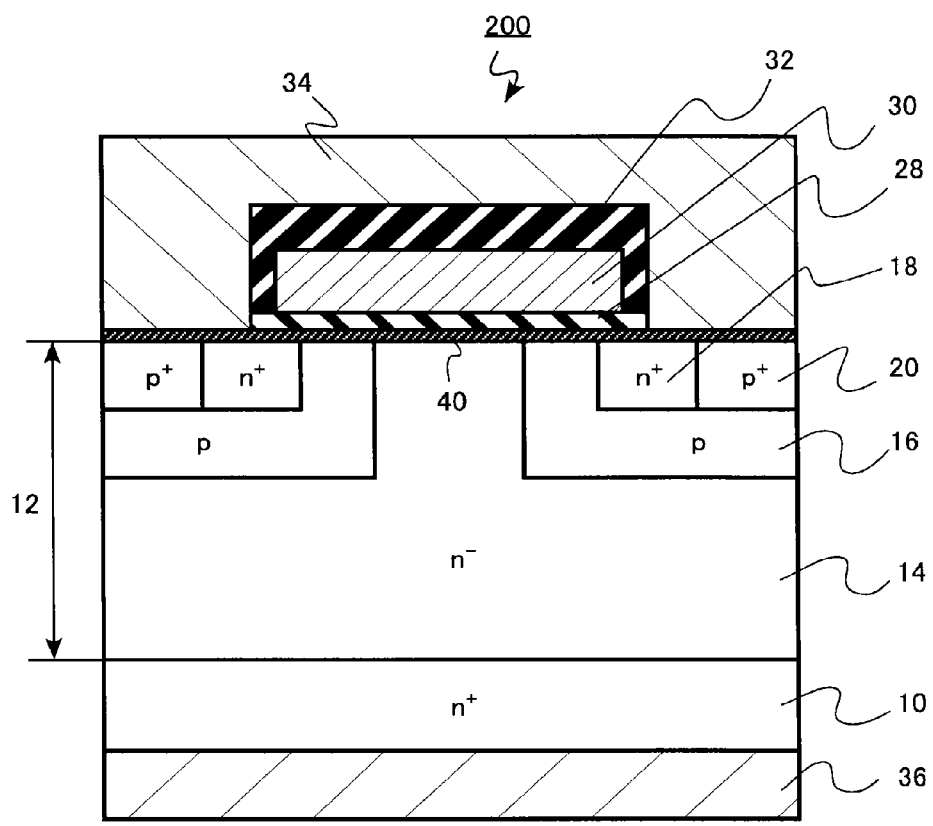
FIG. 10 is a schematic sectional view illustrating a semiconductor device of a third embodiment.

FIG. 10 is a schematic sectional view illustrating a configuration of a MISFET that is the semiconductor device of the present embodiment. In a MISFET 200, an interface region 40 is provided between a surface of a SiC layer 12 and a source electrode 34. The interface region 40 is provided between an $n^+$-type source region 18 and the source electrode 34, and between a $p^+$-type p-well contact region 20 and the source electrode 34.

As illustrated in FIG. 9, the upper edge of the valence band becomes shallower, and the lower edge of the conduction band becomes deeper in the interface region 40. Thus, it is possible to easily reduce both of the contact resistance between the n'-type source region 18 and the source electrode 34, and the contact resistance between the $p^+$-type p-well contact region 20 and the source electrode 34. Consequently, it is possible to easily contact to the $n^+$-type source region 18 and the p-well contact region 20 with an electrode formed of the same material.

As described above, according to the present embodiment, the interface region 40 having high carrier mobility is provided between the SiC layer 12 and the gate insulating layer 28 similarly to the first embodiment. Furthermore, the contact resistance between the source electrode 34 and the interface region 40, and the contact resistance between the source region 18 and the interface region 40 are reduced. Consequently, the MISFET 200 having low on-resistance can be implemented. Furthermore, it is possible to easily form a simultaneous contact using the source electrode 34.

Fourth Embodiment

A semiconductor device of the present embodiment is different from those of the first and second embodiments in that the semiconductor device is a trench gate-type MISFET. Thus, the description overlapping with the first and second embodiments will be omitted.

Figure 11:
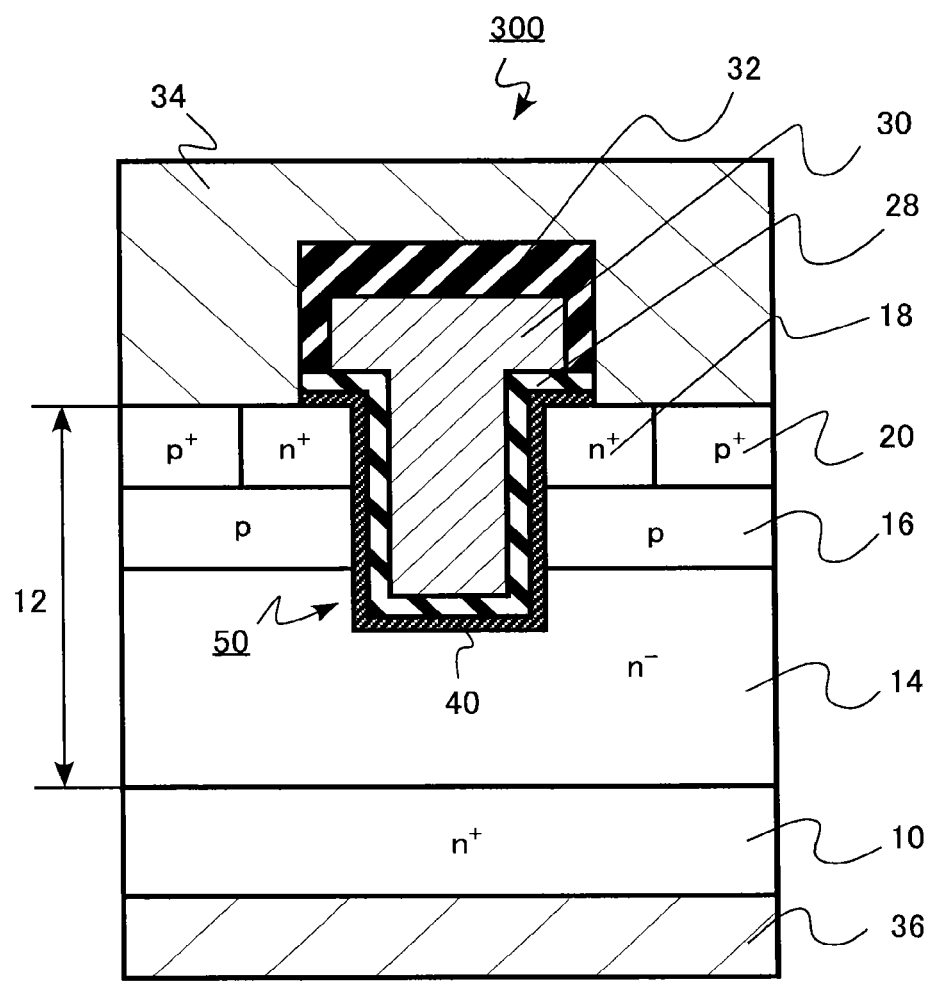
FIG. 11 is a schematic sectional view illustrating a semiconductor device of a fourth embodiment.

FIG. 11 is a schematic sectional view illustrating a configuration of a MISFET that is the semiconductor device of the present embodiment. A MISFET 300 is a trench gate-type MISFET in which a gate insulating layer and a gate electrode are provided in a trench.

The MISFET 300 includes a SiC substrate 10, a SiC layer 12, a drift region (first SiC region) 14, a p-well region (third SiC region) 16, a source region (second SiC region) 18, a p-well contact region 20, a trench 50, an interface region 40, a gate insulating layer (insulating layer) 28, a gate electrode 30, an interlayer insulating layer 32, a source electrode (electrode) 34, and a drain electrode 36.

The surface of the n$^+$-type SiC substrate 10 is inclined, for example, with respect to the carbon face at an angle of 0° to 10°. The SiC substrate 10 is, for example, a 4H—SiC substrate. The surface of the n$^+$-type SiC substrate 10 may be inclined, for example, with respect to the silicon face at an angle of 0° to 10°.

The SiC layer 12 is provided on the SiC substrate 10. The SiC layer 12 includes, for example, nitrogen (N) as the n-type impurity. The SiC layer 12 is, for example, a SiC epitaxial growth layer formed on the SiC substrate 10 by the epitaxial growth. The surface of the SiC layer 12 is inclined with respect to the silicon face at an angle of 0° to 10°.

The n$^-$-type drift region (the first SiC region) 14 is provided in the SiC layer 12. A part of the drift region 14 is in contact with the interface region 40.

The p-type p-well region (the third SiC region) 16 is provided in the SiC layer 12. The p-well region 16 is provided between the drift region 14 and the source region 18. A part of the p-well region 16 is in contact with the interface region 40.

The n$^+$-type source region 18 is provided in the SiC layer 12. The source region 18 is provided in the p-well region 16. A part of the source region 18 is in contact with the interface region 40.

The p$^+$-type p-well contact region 20 is provided in the SiC layer 12. The p-well contact region 20 is provided in the p-well region 16. The p-well contact region 20 is provided on a side of the source region 18.

The trench 50 is provided in the SiC layer 12. An inner wall face of the trench 50 is, for example, the m-face or the a-face.

The gate insulating layer (insulating layer) 28 is provided on the drift region 14, the p-well region 16, and the source region 18 in the trench 50. The gate insulating layer (insulating layer) 28 is provided between the surface of the SiC layer 12, that is, the inner wall face of the trench 50 and the gate electrode 30. The gate electrode 30 is provided on the gate insulating layer 28.

The interface region 40 is provided between the inner wall face of the trench 50 and the gate insulating layer 28. The interface region 40 is two-dimensionally provided between the inner wall face of the trench 50 and the gate insulating layer 28. The interface region 40 is provided between the drift region 14 and the gate insulating layer 28, between the p-well region 16 and the gate insulating layer 28, and between the source region 18 and the gate insulating layer 28. The interface region 40 functions as a channel of the MISFET 300.

The source electrode 34 is provided on the SiC layer 12. The source electrode 34 is electrically connected to the source region 18 and the p-well contact region 20. A side of the source electrode 34 is in contact with the interface region 40. The source electrode 34 also functions as a p-well electrode that applies a potential to the p-well region 16.

The drain electrode 36 is provided on a side of the SiC substrate 10 that is the opposite side of the SiC layer 12, that is, on the back surface side. The drain electrode 36 is electrically connected to the SiC substrate 10.

According to the present embodiment, it is possible to obtain an effect similar to the first embodiment by the existence of the interface region 40. Furthermore, it is possible to improve integration degree of the MISFET by applying a trench gate structure and to reduce the conduction loss by removing the JFET region.

Fifth Embodiment

A semiconductor device of the present embodiment is different from that of the first embodiment in that an n-type MISFET and a p-type MISFET are formed on a same SiC substrate. Hereinafter, the description overlapping with the first embodiment, such as the description of the interface region, will be omitted.

Figure 12:
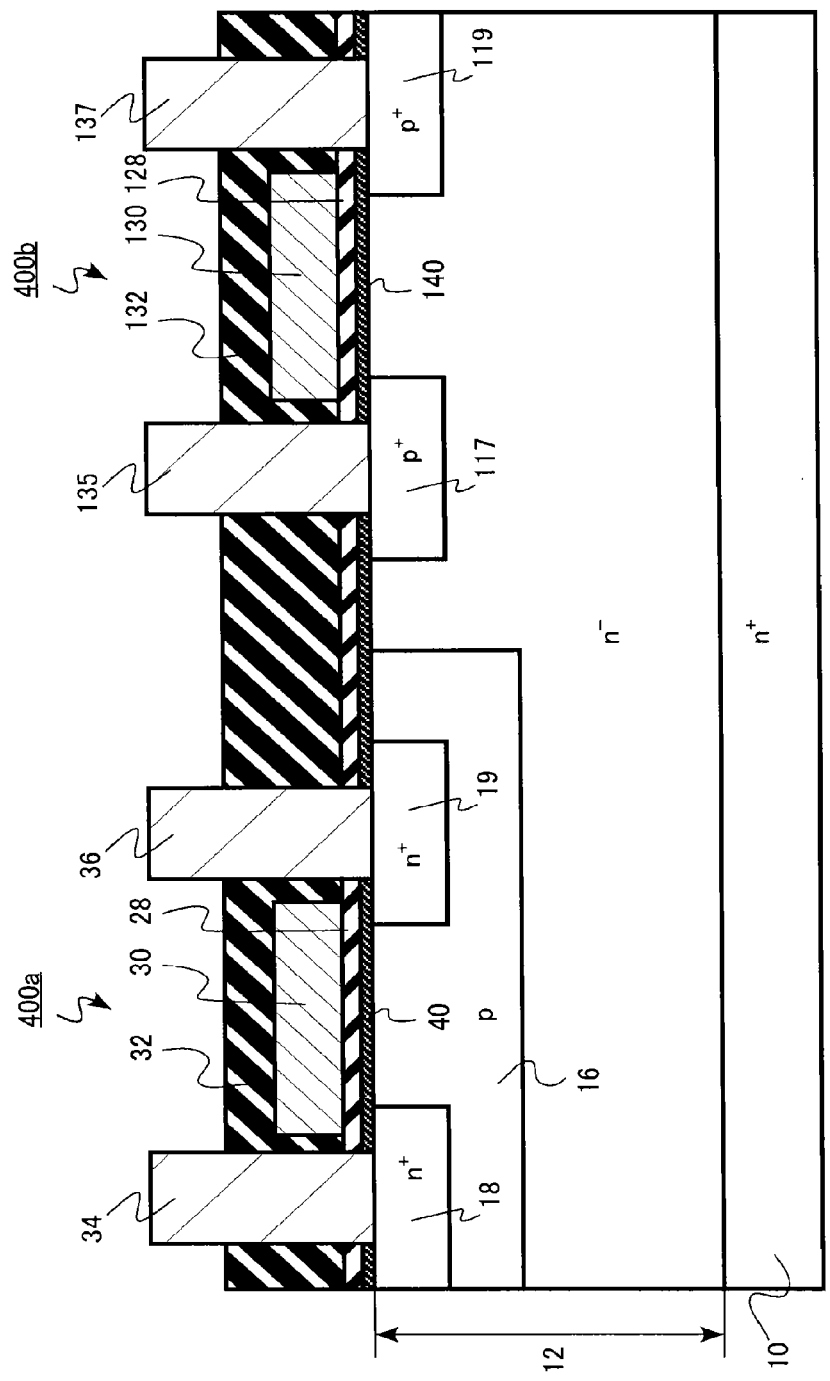
FIG. 12 is a schematic sectional view illustrating a semiconductor device of a fifth embodiment.

FIG. 12 is a schematic sectional view illustrating a configuration of the semiconductor device of the present embodiment. In a MISFET 400 of the present embodiment, an n-type MISFET 400a and a p-type MISFET 400b are formed on a same SiC substrate. The n-type MISFET 400a and the p-type MISFET 400b are lateral devices.

The MISFET 400 of the present embodiment includes an n$^+$-type SiC substrate 10 and an n$^-$-type SiC layer 12. The surfaces of the n$^+$-type SiC substrate 10 and the n$^-$-type SiC layer 12 are inclined, for example, with respect to the carbon face at an angle of 0° to 10°.

The n-type MISFET 400a includes a p-type p-well region 16, an n$^+$-type source region 18, an n$^+$-type drain region 19, an interface region 40, a gate insulating layer (insulating layer) 28, a gate electrode 30, an interlayer insulating layer 32, a source electrode (electrode) 34, and a drain electrode 36. Furthermore, the p-type MISFET 400b includes a p$^+$-type source region 117, a p$^+$-type drain region 119, an interface region 140, a gate insulating layer (insulating layer) 128, a gate electrode 130, an interlayer insulating layer 132, a source electrode (electrode) 135, and a drain electrode 137.

The interface region 40 functions as a low resistance channel, and the on-resistance of the n-type MISFET 400a is reduced accordingly. Furthermore, the interface region 140 functions as a low resistance channel, and the on-resistance of the p-type MISFET 400b is reduced accordingly. Consequently, according to the present embodiment, it is possible to implement the MISFET 400 in which the n-type MISFET 400a having low on-resistance and the p-type MISFET 400b having low on-resistance are provided on the same SiC substrate 10.

Sixth Embodiment

A semiconductor device of the present embodiment is similar to that of the first embodiment except that the semiconductor device is not a MISFET but an IGBT. Thus, the description overlapping with the first embodiment will be omitted.

Figure 13:
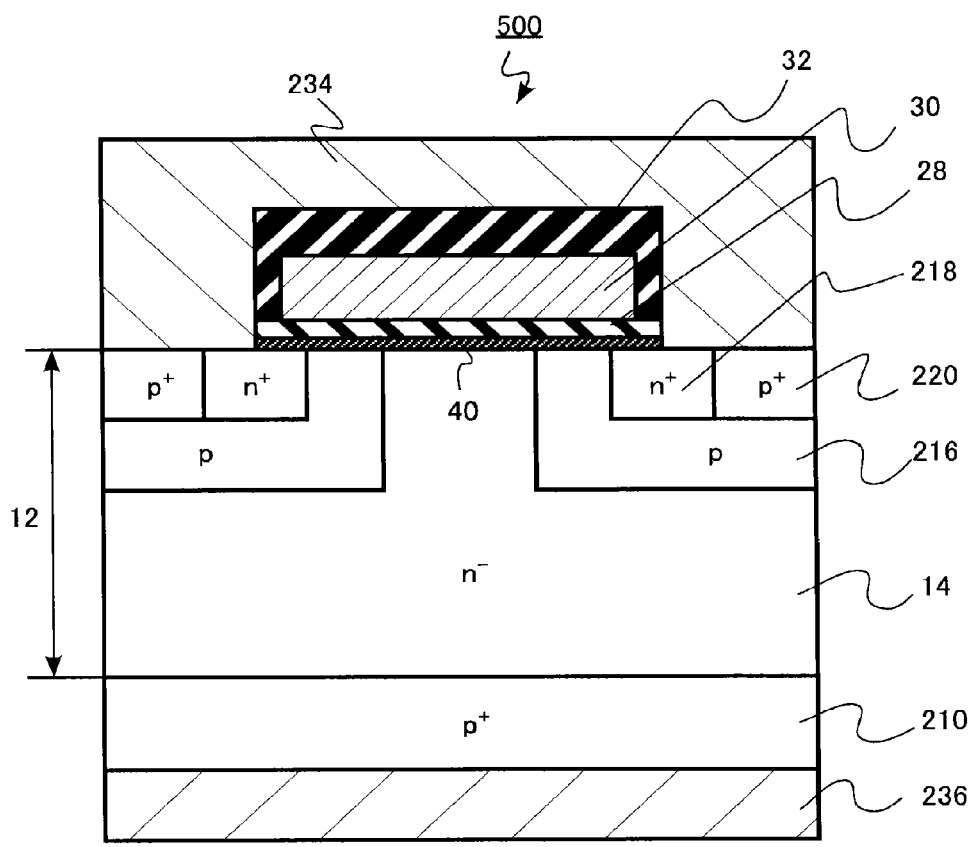
FIG. 13 is a schematic sectional view illustrating a semiconductor device of a sixth embodiment.

FIG. 13 is a schematic sectional view illustrating a configuration of an IGBT that is the semiconductor device of the present embodiment.

An IGBT 500 includes a SiC substrate 210, a SiC layer 12, a drift region (first SiC region) 14, a p-base region (third SiC region) 216, an emitter region (second SiC region) 218, a p-base contact region 220, an interface region 40, a gate insulating layer (insulating layer) 28, a gate electrode 30, an interlayer insulating layer 32, an emitter electrode (electrode) 234, and a collector electrode 236.

The IGBT 500 includes the p$^+$-type SiC substrate 210. The SiC substrate 210 is a 4H—SiC substrate including, for example, aluminum (Al) as a p-type impurity. The impurity concentration of the p-type impurity is, for example, $1\times10^{18}$ cm$^{-3}$ or more and $1\times10^{20}$ cm$^{-3}$ or less.

Hereinafter, it will be described the case where the surface of the SiC substrate 210 is inclined with respect to the carbon face at an angle of 0° to 10°, and the back surface is inclined with respect to the silicon face at an angle of 0° to 10°.

The SiC layer 12 is provided on the SiC substrate 210. The SiC layer 12 includes, for example, nitrogen (N) as the n-type impurity. The n-type impurity concentration in the SiC layer 12 is, for example, $5\times10^{15}$ cm$^{-3}$ or more and $2\times10^{16}$ cm$^{-3}$ or less. The SiC layer 12 is, for example, a SiC epitaxial growth layer formed on the SiC substrate 10 by the epitaxial growth.

The surface of the SiC layer 12 is inclined with respect to the carbon face at an angle of 0° to 10°. The layer thickness of the SiC layer 12 is, for example, 5 µm or more and 100 µm or less.

The n$^-$-type drift region (the first SiC region) 14 is provided in the SiC layer 12. A part of the drift region 14 is in contact with the interface region 40.

The drift region 14 includes, for example, nitrogen (N) as the n-type impurity. The n-type impurity concentration in the drift region 14 is, for example, $5\times10^{15}$ cm$^{-3}$ or more and $2\times10^{16}$ cm$^{-3}$ or less.

The p-type p-base region (the third SiC region) 216 is provided in the SiC layer 12. The p-base region 216 is provided between the drift region 14 and the emitter region 218. A part of the p-base region 216 is in contact with the interface region 40.

The p-base region 216 includes, for example, aluminum (Al) as the p-type impurity. The p-type impurity concentration in the p-base region 216 is, for example, $5\times10^{15}$ cm$^{-3}$ or more and $1\times10^{17}$ cm$^{-3}$ or less. The depth of the p-base region 216 is, for example, about 0.6 µm.

The n$^+$-type emitter region 218 is provided in the SiC layer 12. The emitter region 218 is provided in the p-base region 216. A part of the emitter region 218 is in contact with the interface region 40.

The emitter region 218 includes, for example, nitrogen (N) as an n-type impurity. The n-type impurity concentration in the emitter region 218 is, for example, $1\times10^{18}$ cm$^{-3}$ or more and $1\times10^{22}$ cm$^{-3}$ or less. The depth of the emitter region 218 is shallower than that of the p-base region 216. The depth of the emitter region 218 is, for example, about 0.3 µm.

Furthermore, the p$^+$-type p-base contact region 220 is provided in the SiC layer 12. The p-base contact region 220 is provided in the p-base region 216. The p-base contact region 220 is provided on a side of the emitter region 218.

The p-base contact region 220 includes, for example, aluminum (Al) as the p-type impurity. The p-type impurity concentration of the p-base contact region 220 is, for example, $1\times10^{18}$ cm$^{-3}$ or more and $1\times10^{22}$ cm$^{-3}$ or less. The depth of the p-base contact region 220 is shallower than that of the p-base region 216 and, for example, about 0.3 µm.

The gate insulating layer (insulating layer) 28 is provided on the drift region 14, the p-base region 216, and the emitter region 218. The gate insulating layer (insulating layer) 28 is provided between the surface of the SiC layer 12 and the gate electrode 30.

For example, an oxide film is applied to the gate insulating layer 28. For example, a silicon oxide film, a silicon oxynitride film, or a high-k insulating layer is applicable to the gate insulating layer 28.

The gate electrode 30 is provided on the gate insulating layer 28. For example, doped polysilicon or the like is applicable to the gate electrode 30.

The interlayer insulating layer 32 is provided on the gate electrode 30. The interlayer insulating layer 32 is formed of, for example, a silicon oxide film.

The interface region 40 is provided between the surface of the SiC layer 12 and the gate insulating layer 28. The interface region 40 is two-dimensionally provided between the surface of the SiC layer 12 and the gate insulating layer 28. The interface region 40 is provided between the drift region 14 and the gate insulating layer 28, between the p-base region 216 and the gate insulating layer 28, and between the emitter region 218 and the gate insulating layer 28. The interface region 40 functions as a channel of the IGBT 500.

The interface region 40 includes a bond between carbon and carbon (carbon-carbon bond). The interface region 40 includes a six-membered ring structure having a silicon-carbon-carbon-silicon-carbon-carbon bond. A single layer having the six-membered ring structure is two-dimensionally provided between the surface of the SiC layer 12 and the gate insulating layer 28.

The carbon concentration in the interface region 40 is higher than those of the SiC layer 12 and the gate insulating layer 28. Thus, the peak of the carbon concentration distribution in the SiC layer 12, the interface region 40, and the gate insulating layer 28 exists in the interface region 40.

The area density of carbon in the interface region 40 is, for example, $1.2\times10^{14}$ cm$^{-2}$ or more and $2.4\times10^{15}$ cm$^{-2}$ or less. The volume density of carbon in the interface region 40 is, for example, $4.8\times10^{21}$ cm$^{-3}$ or more and $2.0\times10^{23}$ cm$^{-3}$ or less.

The emitter electrode 234 is provided on the SiC layer 12. The emitter electrode 234 is electrically connected to the emitter region 218 and the p-base contact region 220. A side of the emitter electrode 234 is in contact with the interface region 40. The emitter electrode 234 also functions as a p-base electrode that applies a potential to the p-base region 216.

The emitter electrode 234 is a conductive material. The emitter electrode 234 is, for example, metal or metal silicide. The emitter electrode 234 has, for example, a laminate structure of a nickel silicide layer and an aluminum (Al) metal layer on the nickel silicide layer.

The collector electrode 236 is provided on a side of the SiC substrate 210 that is the opposite side of the SiC layer 12, that is, on the back surface side. The collector electrode 236 is electrically connected to the SiC substrate 210.

The collector electrode 236 is a conductive material. The collector electrode 236 is, for example, metal or metal silicide. The collector electrode 236 has, for example, a laminate structure of a nickel silicide layer and a gold (Au) layer on the nickel silicide layer.

Note that, in the present embodiment, the n-type impurity is preferably, for example, nitrogen (N) or phosphorus (P), but arsenic (As) or antimony (Sb) is also applicable. Furthermore, the p-type impurity is preferably, for example, aluminum (Al), but boron (B), gallium (Ga), or indium (In) is also applicable.

According to the present embodiment, it is possible to obtain a function and effect similar to the first embodiment by providing the interface region 40. Consequently, the IGBT 500 having low on-resistance can be implemented.

Seventh Embodiment

A semiconductor device of the present embodiment includes a SiC layer having a surface inclined with respect to a {000-1} face at an angle of 0° to 10° or a surface a normal line direction of which is inclined with respect to a <000-1> direction at an angle of 80° to 90°, a conductive layer, and a region provided between the surface and the conductive layer and including a bond between carbon and carbon. Hereinafter, the description overlapping with the first embodiment, such as the description of the interface region, will be omitted.

Figure 14:
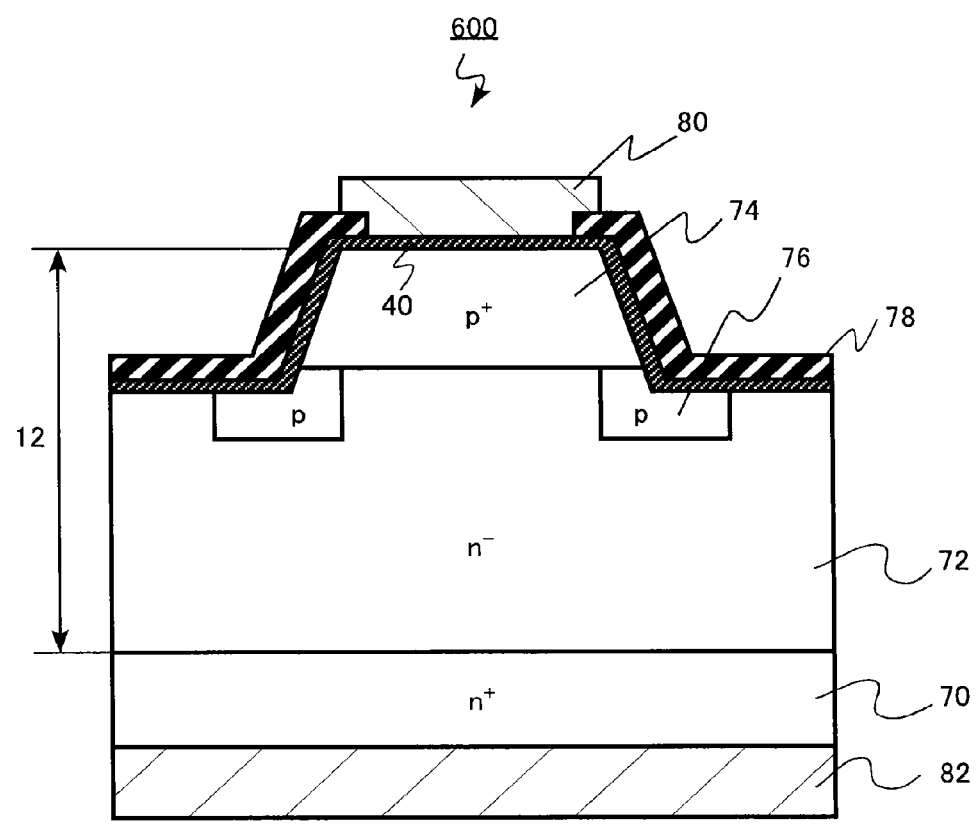
FIG. 14 is a schematic sectional view illustrating a semiconductor device of a seventh embodiment.

FIG. 14 is a schematic sectional view illustrating a configuration of a PIN diode that is the semiconductor device of the present embodiment.

A PIN diode 600 includes an $n^+$-type cathode region 70, a SiC layer 12, an $n^-$-type drift region 72, a $p^+$-type anode region 74, a p-type guard ring 76, an interface region 40, a protective film 78, an anode electrode (conductive layer) 80, and a cathode electrode 82.

The $n^-$-type drift region 72, the $p^+$-type anode region 74, and the p-type guard ring 76 are provided in the SiC layer 12. The interface region 40 is provided between the $p^+$-type anode region 74 and the anode electrode 80.

The surface of the $p^+$-type anode region 74 is inclined with respect to the {000-1} face at an angle of 0° to 10° or the normal line direction of the surface is inclined with respect to the <000-1> direction at an angle of 80° to 90°.

The valence band and the conduction band in the interface region 40 extend in the band gap as illustrated in FIG. 9. Thus, the upper edge of the valence band becomes shallower. Consequently, materials for the conductive layer to form the contact to the p-type SiC region can be widely selected. For example, the upper edge of the valence band is shallow, metal having relatively low work function can reduce the Schottky barrier between the p-type SiC region and the metal. Consequently, it is possible to reduce the contact resistance between the $p^+$-type anode region 74 and the anode electrode 80.

According to the present embodiment, by providing the interface region 40, the contact resistance is reduced and the PIN diode 600 having reduced on-resistance can be implemented.

Eighth Embodiment

A semiconductor device of the present embodiment includes a SiC layer having a surface inclined with respect to a {000-1} face at an angle of 0° to 10° or a surface a normal line direction of which is inclined with respect to a <000-1> direction at an angle of 80° to 90°, an insulating layer, and a region, at least a part of which is provided between the surface and the insulating layer, including a bond between carbon and carbon.

The semiconductor device of the present embodiment is different from that of the first embodiment in that an interface region 40 is used not as a channel of a MISFET but as a wiring of a MISFET. Hereinafter, the description overlapping with the first embodiment, such as the description of the interface region 40 and the functions, will be omitted.

Figure 15:
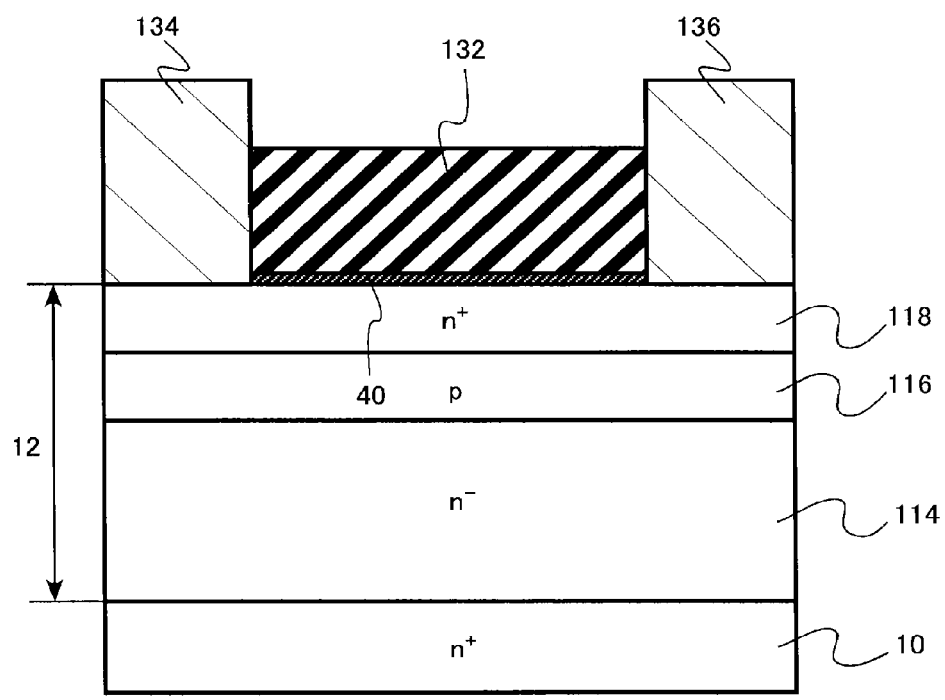
FIG. 15 is a schematic sectional view illustrating a semiconductor device of an eighth embodiment.

FIG. 15 is a schematic sectional view illustrating the semiconductor device of the present embodiment. The semiconductor device of the present embodiment includes a SiC substrate 10, a SiC layer 12, an $n^-$-type SiC layer 114, a p-type SiC layer 116, an $n^+$-type SiC layer 118, the interface region 40, an interlayer insulating layer (insulating layer) 132, a first electrode 134, and a second electrode 136.

The interface region 40 is provided between the surface of the SiC layer 12 and the interlayer insulating layer (insulating layer) 132. The interface region 40 is provided on the $n^+$-type SiC layer 118.

The interface region 40 and the $n^+$-type SiC layer 118 are provided between the first electrode 134 and the second electrode 136. The interface region 40 and the $n^+$-type SiC layer 118 function as a wiring that connects the first electrode 134 to the second electrode 136.

The first electrode 134 and the second electrode 136 are provided on the SiC layer 12. The first electrode 134 and the second electrode 136 are formed of a conductive material. The first electrode 134 and the second electrode 136 are, for example, metal or metal silicide.

A side of the first electrode 134 is in contact with the interface region 40. A side of the second electrode 136 is in contact with the interface region 40.

The $n^+$-type SiC layer 118 is processed into a desired wiring pattern by a known photolithography method and ion implantation method. Furthermore, the interface region 40 is processed into a desired wiring pattern by a known photolithography method and etching method.

The effective mass of the carriers becomes lighter in the planar direction of the interface region 40, and the carrier mobility is improved in the planar direction of the interface region 40. Consequently, a low resistance wiring that connects the first electrode 134 to the second electrode 136 can be implemented.

Although it has been described that the interface region 40 is provided on the $n^+$-type SiC layer 118 and the wiring having carriers as electrons is formed in the present embodiment, the interface region 40 may be provided on the $p^+$-type SiC layer and the wiring having carriers as positive holes may be formed.

According to the present embodiment, a low resistance wiring can be implemented.

Ninth Embodiment

A semiconductor device of the present embodiment is different from that of the eighth embodiment in that an interface region is provided between an electrode and a surface of a SiC layer. The description overlapping with the eighth embodiment will be omitted.

Figure 16:
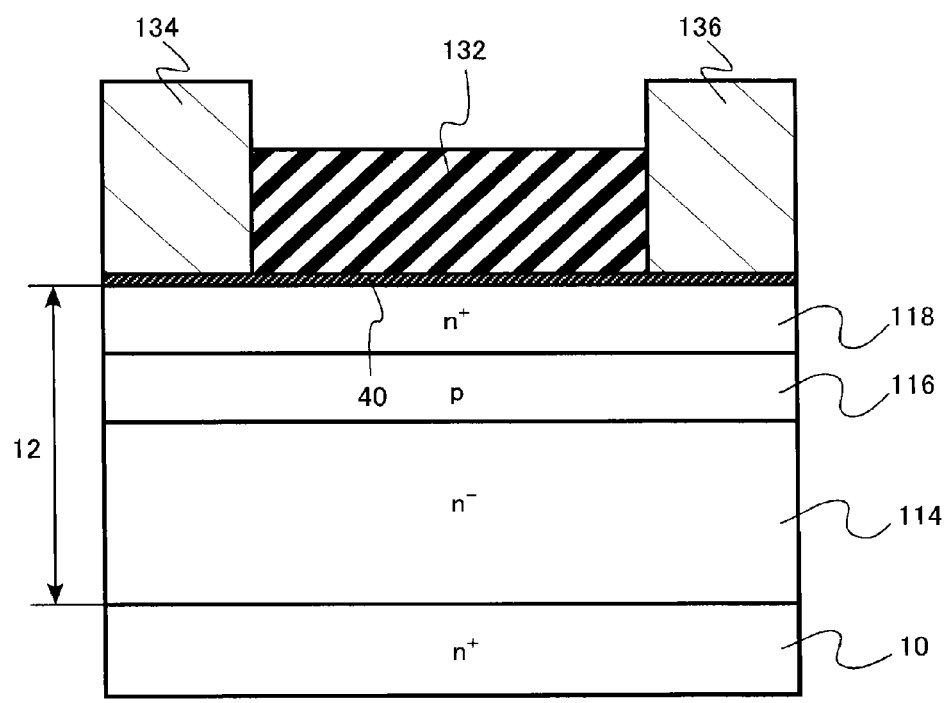
FIG. 16 is a schematic sectional view illustrating a semiconductor device of a ninth embodiment.

FIG. 16 is a schematic sectional view illustrating the semiconductor device of the present embodiment. In the semiconductor device of the present embodiment, an interface region 40 is provided between a surface of a SiC layer 12 and a first electrode 134. Furthermore, the interface region 40 is provided between the surface of the SiC layer 12 and a second electrode 136.

According to the present embodiment, a low resistance wiring can be implemented similarly to the eighth embodiment.

In the first to ninth embodiments, it is possible to improve characteristics of a device in which an n-type and a p-type are switched.

As described above, in the embodiments, although it has been described the case where a crystal structure of silicon carbide is 4H—SiC, the present disclosure is applicable to silicon carbide having a 6H—SiC, 3C—SiC, or other crystal structure.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a SiC layer having a surface, the surface inclined with respect to a {000-1} face at an angle of 0° to 10° or the surface having a normal line direction inclined with respect to a <000-1> direction at an angle of 80° to 90°;
   a gate electrode;
   an insulating layer, at least a part of the insulating layer provided between the surface and the gate electrode; and
   a region, at least a part of the region provided between the surface and the insulating layer, the region comprising a six-membered ring structure having a silicon-carbon-carbon-silicon-carbon-carbon bond.

2. The device according to claim 1, wherein the at least a part of the region is two-dimensionally provided between the surface and the insulating layer.

3. The device according to claim 1, further comprising:
   a first conductive type first SiC region provided in the SiC layer, at least a part of the first SiC region being in contact with the region;
   a first conductive type second SiC region provided in the SiC layer, at least part of the second SiC region being in contact with the region; and
   a second conductive type third SiC region provided in the SiC layer, the third SiC region provided between the first SiC region and the second SiC region, and at least part of the third SiC region being in contact with the region.

4. The device according to claim 1, further comprising an electrode comprising metal or metal silicide, wherein the region is provided between the electrode and the surface.

5. The device according to claim 1, further comprising an electrode comprising metal or metal silicide, wherein a side of the electrode is in contact with the region.

6. The device according to claim 1, wherein the insulating layer comprises a silicon oxide film.

7. A semiconductor device comprising:
   a SiC layer having a surface, the surface inclined with respect to a {000-1} face at an angle of 0° to 10° or the surface having a normal line direction inclined with respect to a <000-1> direction at an angle of 80° to 90°;
   a gate electrode;
   an insulating layer, at least a part of the insulating layer provided between the surface and the gate electrode; and
   a region, at least a part of the region provided between the surface and the insulating layer, the region comprising a bond between carbon and carbon,
   wherein a peak of carbon concentration distribution in the SiC layer, the region, and the insulating layer exists in the region.

8. The device according to claim 7, wherein the at least a part of the region is two-dimensionally provided between the surface and the insulating layer.

9. The device according to claim 7, further comprising:
   a first conductive type first SiC region provided in the SiC layer, at least a part of the first SiC region being in contact with the region;
   a first conductive type second SiC region provided in the SiC layer, at least part of the second SiC region being in contact with the region; and
   a second conductive type third SiC region provided in the SiC layer, the third SiC region provided between the first SiC region and the second SiC region, and at least part of the third SiC region being in contact with the region.

10. The device according to claim 7, further comprising an electrode comprising metal or metal silicide, wherein the region is provided between the electrode and the surface.

11. The device according to claim 7, further comprising an electrode comprising metal or metal silicide, wherein a side of the electrode is in contact with the region.

12. The device according to claim 7, wherein the insulating layer comprises a silicon oxide film.

13. A semiconductor device comprising:
    a SiC layer having a surface, the surface inclined with respect to a {000-1} face at an angle of 0° to 10° or the surface having a normal line direction inclined with respect to a <000-1> direction at an angle of 80° to 90°;
    a conductive layer; and
    a region provided between the surface and the conductive layer, the region comprising a six-membered ring structure having a silicon-carbon-carbon-silicon-carbon-carbon bond.

14. The device according to claim 13, wherein the conductive layer comprises metal or metal silicide.

15. The device according to claim 13, wherein the region is two-dimensionally provided between the surface and the conductive layer.

16. A semiconductor device comprising:
    a SiC layer having a surface, the surface inclined with respect to a {000-1} face at an angle of 0° to 10° or the surface having a normal line direction inclined with respect to a <000-1> direction at an angle of 80° to 90°;
    a conductive layer; and
    a region provided between the surface and the conductive layer, the region comprising a bond between carbon and carbon,
    wherein a peak of carbon concentration distribution in the SiC layer, the region, and the conductive layer exists in the region.

17. The device according to claim 16, wherein the conductive layer comprises metal or metal silicide.

18. The device according to claim 16, wherein the region is two-dimensionally provided between the surface and the conductive layer.

19. A semiconductor device comprising:
    a SiC layer having a surface, the surface inclined with respect to a {000-1} face at an angle of 0° to 10° or the surface a normal line direction of which is inclined with respect to a <000-1> direction at an angle of 80° to 90°;
    an insulating layer; and
    a region, at least a part of the region provided between the surface and the insulating layer, the region comprising a six-membered ring structure having a silicon-carbon-carbon-silicon-carbon-carbon bond.

20. The device according to claim 19, wherein the at least a part of the region is two-dimensionally provided between the surface and the insulating layer.

21. The device according to claim 19, further comprising an electrode comprising metal or metal silicide, wherein the region is provided between the electrode and the surface.

22. The device according to claim 19, further comprising an electrode comprising metal or metal silicide, wherein a side of the electrode is in contact with the region.

23. The device according to claim 19, wherein the insulating layer comprises a silicon oxide film.

24. A semiconductor device comprising:
   a SiC layer having a surface, the surface inclined with respect to a {000-1} face at an angle of 0° to 10° or the surface a normal line direction of which is inclined with respect to a <000-1> direction at an angle of 80° to 90°;
   an insulating layer; and
   a region, at least a part of the region provided between the surface and the insulating layer, the region comprising a bond between carbon and carbon,
   wherein a peak of carbon concentration distribution in the SiC layer, the region, and the insulating layer exists in the region.

25. The device according to claim 24, wherein the at least a part of the region is two-dimensionally provided between the surface and the insulating layer.

26. The device according to claim 24, further comprising an electrode comprising metal or metal silicide, wherein the region is provided between the electrode and the surface.

27. The device according to claim 24, further comprising an electrode comprising metal or metal silicide, wherein a side of the electrode is in contact with the region.

28. The device according to claim 24, wherein the insulating layer comprises a silicon oxide film.

* * * * *